United States Patent
Li et al.

(10) Patent No.: US 9,400,304 B2
(45) Date of Patent: Jul. 26, 2016

(54) METHOD AND APPARATUS FOR TESTING THE EXCITATION CHARACTERISTIC OF CURRENT TRANSFORMER

(71) Applicant: PONOVO POWER CO., LTD., Beijing (CN)

(72) Inventors: Yake Li, Beijing (CN); Wei Chen, Beijing (CN); Sen Zhang, Beijing (CN); Jingfeng Zhao, Beijing (CN)

(73) Assignee: Ponovo Power Co., Ltd., Beijing (CN)

( * ) Notice: Subject to any disclaimer, the term of this patent is extended or adjusted under 35 U.S.C. 154(b) by 576 days.

(21) Appl. No.: 13/869,546

(22) Filed: Apr. 24, 2013

(65) Prior Publication Data

US 2014/0156212 A1    Jun. 5, 2014

(30) Foreign Application Priority Data

Dec. 5, 2012  (CN) .......................... 2012 1 0518036

(51) Int. Cl.
*G01R 31/06* (2006.01)
*G01R 31/02* (2006.01)
(52) U.S. Cl.
CPC ..................................... *G01R 31/027* (2013.01)
(58) Field of Classification Search
CPC ....................................................... G01R 31/282

USPC .................................. 324/547, 726; 702/119
See application file for complete search history.

(56) References Cited

U.S. PATENT DOCUMENTS

2004/0130329 A1* 7/2004 Suss ....................... G01R 35/02
                                                                      324/547

* cited by examiner

*Primary Examiner* — Lam Nguyen
(74) *Attorney, Agent, or Firm* — Muncy, Geissler, Olds & Lowe, P.C.

(57) ABSTRACT

This disclosure relates to the field of current transformers, for testing the excitation characteristic of a current transformer is disclosed. The method comprise applying alternately positive and negative DC voltages across terminals of secondary winding of a CT to be tested and acquiring a secondary current; constructing a mathematical model of the relationship between the secondary current and a root mean square (rms) equivalent voltage at rated frequency of the CT from the relationship between a magnetic flux of a secondary winding iron-core of the CT and the rms equivalent voltage; and generating an excitation characteristic curve according to the mathematical model. The method and apparatus of the embodiments may test CTs requiring lower testing voltage as well as CTs with knee-point up to tens of kV by supplying a relatively low voltage and power, which makes the embodiments widely applicable.

15 Claims, 2 Drawing Sheets

METHOD AND APPARATUS FOR TESTING THE EXCITATION CHARACTERISTIC OF CURRENT TRANSFORMER

FIELD

This disclosure relates generally to current transformers, more particularly, to a method and apparatus for testing the excitation characteristic of current transformers.

BACKGROUND

Inductive current transformers, also known as current transformers (hereinafter also referred to as CT) for short, are widely used in electric measuring and relay protection. A CT transforms a higher primary current to a lower secondary current (or current in the secondary loop) with a certain ratio through core coupling based on the principle of electromagnetic induction, thereby reducing a high current of high-voltage power grid to a low current. A current transformer generally has closed core and windings, in which windings comprise primary winding and secondary winding. The primary winding together with the high-voltage loop are know as primary loop, while the external loop from the secondary winding of the CT to the measuring point is referred to as secondary current branch.

In order to transfer energy between the first and second windings, the CT has to first establish magnetic field. Such a magnetic field suffers from losses and a current known as exciting current is needed to maintain the magnetic field. The excitation characteristic of the secondary winding of the CT is a critical factor in evaluating the performance of the CT. Thus, the excitation characteristic experiment is one of the most effective and most widely used methods for testing the performance of protective current transformers. According to the excitation characteristic curve obtained from the excitation characteristic experiment, performance indexes for evaluating CTs as specified in IEC international standards "IEC60044-6 Instrument transformers—Part 6: Requirements for protective current transformers for transient performance" and "IEC60044-1 Instrument transformers—Part 1: Current transformers" can be measured. Those indexes may be, for example, composite error of the CT, accuracy limit factor (ALF) of the CT, secondary loop time constant Ts of the CT, knee-point, composite error, remanence factor, transient performance (for class-TP CTs) etc.

A conventional method for testing the excitation characteristic of CT is the power-frequency method, in which power-frequency voltage is applied across the secondary winding. The method works well for some CTs. However, class-P and class-TP protective CTs with a rated secondary current of 1 A are frequently used in practice, especially in extra-high and ultra-high voltage systems and large capacity generating sets. The knee-point voltage of such CTs is very high. When testing the excitation characteristic of such CTs, a power-frequency voltage of e.g. 2 kV or higher, even up to over 20 kV, is generally applied to the secondary winding. A large device capacity is required for applying such high voltage to the secondary winding. Meanwhile, the safety of operators of the experiments and the secondary wiring terminals can not be guaranteed by so high a voltage, which makes the experiment or test infeasible. As a result, the application scope of testing the excitation characteristic of the CTs using power-frequency method is limited.

SUMMARY

In view of the above, one of the technical problem to be solved is to provide a widely applicable method and apparatus for testing excitation characteristic of CTs.

To this end, a first aspect provides a method for testing excitation characteristic of a current transformer comprises:

applying alternately positive and negative DC voltages across terminals of secondary winding of a CT to be tested and acquiring a secondary current;

constructing a mathematical model of a relationship between the secondary current and a root mean square (rms) equivalent voltage at rated frequency of the CT from a relationship between a magnetic flux of a secondary iron-core of the CT and the rms equivalent voltage; and generating an excitation characteristic curve according to the mathematical model.

In connection with the above aspect, the mathematical model according to a first possible implementation is:

$$Uc = \frac{2\pi f}{\sqrt{2}} * \left\{ \int_0^\tau [U(t) - Rct * Ict(t)]dt + \Phi(0) \right\}$$

where Uc is the rms equivalent voltage of the CT at the rated frequency of the CT, f is the rated frequency of the CT, U(t) is an amplitude of the DC voltage applied to the terminals of the secondary winding at time t, Rct is a DC resistance of the secondary winding, Ict(t) is the secondary current acquired at time t, and $\Phi(0)$ is the magnetic flux of the secondary iron-core when time t=0.

Based on the first possible implementation in connection with the first aspect, according to a second possible implementation, the step of acquiring the secondary current each time the positive or negative DC voltage is applied across the terminals of the secondary winding of the CT to be tested comprises:

setting a target secondary current;

applying the positive or negative DC voltage across the terminals of the secondary winding of the CT to be tested; and acquiring the secondary current, and once the acquired secondary current reaches the target secondary current, the positive or negative DC voltage is stopped from being applied to the terminals of the secondary winding of the CT to be tested.

Based on the second possible implementation in connection with the first aspect, according to a third possible implementation, in the step of applying alternately the positive and negative DC voltages across the terminals of the secondary winding of the CT to be tested and acquiring the secondary current, a positive and a negative DC voltage are applied for at least one time.

Based on the second or third possible implementation in connection with the first aspect, according to a fourth possible implementation, the target secondary current set each time is the same or not all the same; the amplitude of the positive and negative DC voltage applied each time is the same or not all the same.

Based on any of the first to the fourth possible implementation in connection with the first aspect, according to a fifth possible implementation, the method further comprises:

supplying a DC current to the terminals of the secondary winding of the CT to be tested and measuring the voltage across the terminals as well as the secondary current; and obtaining the DC resistance Rct of the secondary winding from the measured voltage across the terminals of the secondary winding and the measured secondary current.

Based on the fifth possible implementation in connection with the first aspect, according to a sixth possible implementation, the amplitude of the positive and negative DC voltage applied each time is larger than Rct*Ict$_{target}$, where Ict$_{target}$ is the set target secondary current.

A second aspect provides an apparatus for testing excitation characteristic of a current transformer comprising, a testing unit for applying alternately positive and negative DC voltages across terminals of secondary winding of a CT to be tested and acquiring a secondary current;

a model constructing unit for constructing a mathematical model of a relationship between the secondary current and a rms equivalent voltage at rated frequency of the CT from a relationship between a magnetic flux of a secondary winding iron-core of the CT and the rms equivalent voltage; and an excitation characteristic curve generating unit for generating the excitation characteristic curve according to the model constructed by the model constructing unit.

In connection with the second aspect, according to a first possible implementation, the testing unit comprises:

a power output subunit for applying alternately the positive and negative DC voltage across the terminals of the secondary winding of the CT to be tested; and a current acquiring subunit for acquiring the secondary current of the secondary winding of the CT after applying the DC voltage across the terminals of the secondary winding of the CT to be tested by the power output subunit.

Based on the first possible implementation of the second aspect, according to a second possible implementation, the power output subunit is also for supplying a DC current to the terminals of the secondary winding of the CT to be tested;

the testing unit further comprises:

a voltage acquiring subunit for acquiring the voltage across the terminals of the secondary winding of the CT to be tested after the DC current is supplied;

the current acquiring subunit is also for acquiring the secondary current of the CT to be tested after the DC current is supplied;

a computation subunit is for computing the DC resistance of the secondary winding, according to the voltage acquired by the voltage acquiring subunit and the secondary current acquired by the current acquiring subunit.

The method and apparatus provided by the implementations may test the excitation characteristic of the CT by alternately applying positive and negative DC voltage and constructing the mathematical model of the relationship between the secondary current and the rms equivalent voltage. The implementations may be applied to CTs requiring lower testing voltage as well as CTs with knee-point up to tens of kV by supplying a relatively low voltage and power, which makes the implementations widely applicable.

Moreover, according to the method and apparatus provided by the implementations, positive and negative DC voltages are alternately applied across the terminals of the secondary windings of the CT. An excitation characteristic curve with higher accuracy may be obtained by, for example, further increasing the number of times of positive/negative DC voltage application, thereby further increasing the accuracy of the excitation characteristic test.

DETAILED DESCRIPTION

The method and apparatus for testing the excitation characteristic of CTs will be described in connection with the following embodiments, with reference to the drawings.

Figure 1:
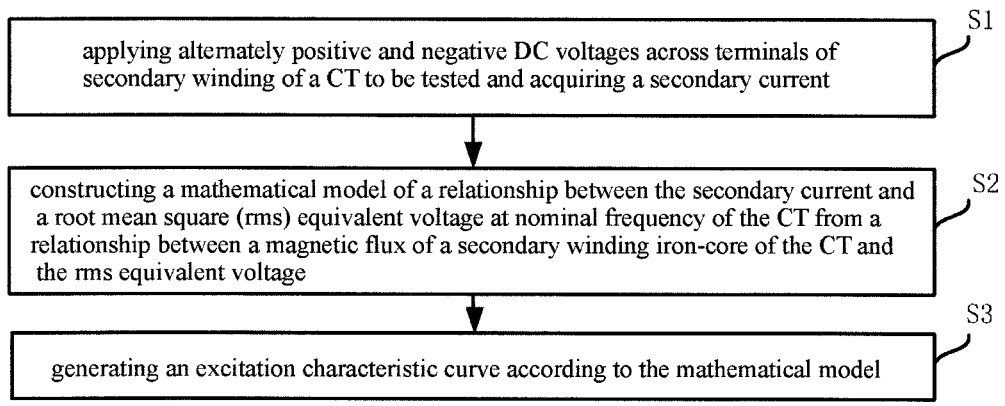
FIG. 1 is a flow chart of a method for testing the excitation characteristic of CTs in accordance with an embodiment.

As shown in FIG. 1, the method for testing the excitation characteristic of CTs according to an embodiment comprises the following steps:

S1: Positive and negative DC voltages are alternately applied across the two terminals of the secondary winding of the CT to be tested, and the current in the secondary loop is acquired.

S2: According to the relationship between the magnetic flux of the secondary winding iron-core of the CT and the rms equivalent voltage of the CT at rated frequency of the CT is formulated, the relationship between the current in the secondary loop and the equivalent root mean square (rms) voltage is formulated as a mathematical model.

The relationship between the magnetic flux of the secondary winding iron-core of the CT and the current in the secondary loop is as follows:

$$\Phi(t) = \int_0^t [U(t) - Rct*Ict(t)]dt + \Phi(0) \quad (1)$$

where $\Phi(t)$ is the magnetic flux of the secondary winding iron-core of the CT at time t, U(t) is the amplitude of the DC voltage applied to the terminals of the secondary windings at t, Rct is the DC resistance of the secondary winding, Ict(t) is the current in the secondary loop collected at t, and $\Phi(0)$ is the initial magnetic flux of the secondary winding iron-core. Moreover, the magnetic flux of the secondary winding iron-core of the CT and the rms equivalent voltage at the rated frequency of the CT has the following relationship:

$$Uc = \frac{2\pi f}{\sqrt{2}} * \Phi \quad (2)$$

Thus, the following mathematical model is derived at step S2 from eqs. (1) and (2):

$$Uc = \frac{2\pi f}{\sqrt{2}} * \left\{ \int_0^t [U(t) - Rct*Ict(t)]dt + \Phi(0) \right\} \quad (3)$$

Where Uc is the rms equivalent voltage of the CT at the rated frequency of the CT.

S3: The excitation characteristic curve is generated according to the mathematical model established in step S2.

Figure 2:
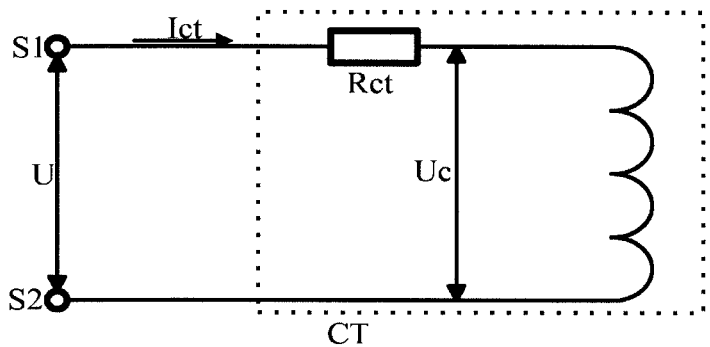
FIG. 2 illustrates an equivalent circuit of the CT's secondary loop.

The equivalent circuit diagram of the secondary loop of the CT is shown in FIG. 2. According to the method of this embodiment, the excitation characteristic of the CT is tested by alternately applying positive and negative DC voltage U across the terminals S1, S2 (the load terminals of the CT, i.e. measurement terminals) of the secondary windings and then constructing a mathematical model of the relationship between the current in the secondary loop and the rms equivalent voltage. According to the method, it may test CTs requiring lower testing voltage as well as CTs with knee-point up to tens of kV with a low voltage and a low power, which makes the method widely applicable.

More specifically, at step S1, the positive or negative DC voltage is applied across the terminals of the secondary windings of the CT to be tested each time by means of the following steps:

S11: A target current value Ict$_{target}$ of the secondary loop that is to be achieved by applying the DC voltage is set, which may be set appropriately based on the DC resistance Rct of the CT to be tested and the load capacity of the power output.

Please note that the target current value of the secondary loop that is to be attained each time by applying the DC voltage can be the same or not all the same. Thus, the time required for reaching the target current value of the secondary loop, i.e. the time of applying the DC voltage, can be the same or for each time not all the same.

S12: The positive/negative DC voltage U is applied to the terminals of the secondary windings of the CT.

S13: The current in the secondary loop is acquired, and once the acquired current in the secondary loop reaches the target current $Ict_{target}$ as set in step S11, the positive/negative DC voltage is stopped from being applied to the terminals of the secondary windings of the CT.

Thereafter, a negative/positive DC voltage is applied for the next time as specified in steps S11 to S13, and so forth. In the method of the embodiment, it is ensured that the positive and negative DC voltage are alternately applied for at least one time so that the iron-core of the CT can demagnetized automatically. Besides, an excitation characteristic curve with higher accuracy may be obtained by increasing the number of times for applying positive/negative DC current, thereby increasing the accuracy of the excitation characteristic test.

Furthermore, the DC resistance Rct of the secondary windings of the CT may be determined as follows:

A DC current of predetermined value is input to the terminals of the secondary windings of the CT to be tested, and the voltage across the terminals of the secondary windings as well as the current in the secondary loop are measured. The DC resistance Rct of the secondary windings is then obtained based on the measured voltage across the terminals of the secondary windings and current in the secondary loop. The voltage across the terminals of the secondary windings and the current in the secondary loop after said DC current is input may be measured more than once so as to obtain a more accurate DC resistance Rct.

Please be further noted that at step S1, provided that the amplitude of the positive/negative DC voltage alternately applied to the terminals of the secondary windings being larger than $Rct*Ict_{target}$, the amplitude of the DC voltage applied to the terminals of the secondary windings for each time may be the same or not all the same.

With the excitation characteristic curve obtained at step S3, it may now determine the composite error of the CT, estimate the ALF of the CT, calculate parameters of the CT such as the secondary loop time constant Ts, knee-point, composite error, remanence factor and transient performance (for class-TP CT), and then finish testing the excitation characteristic of the CT to be tested.

Figure 3:
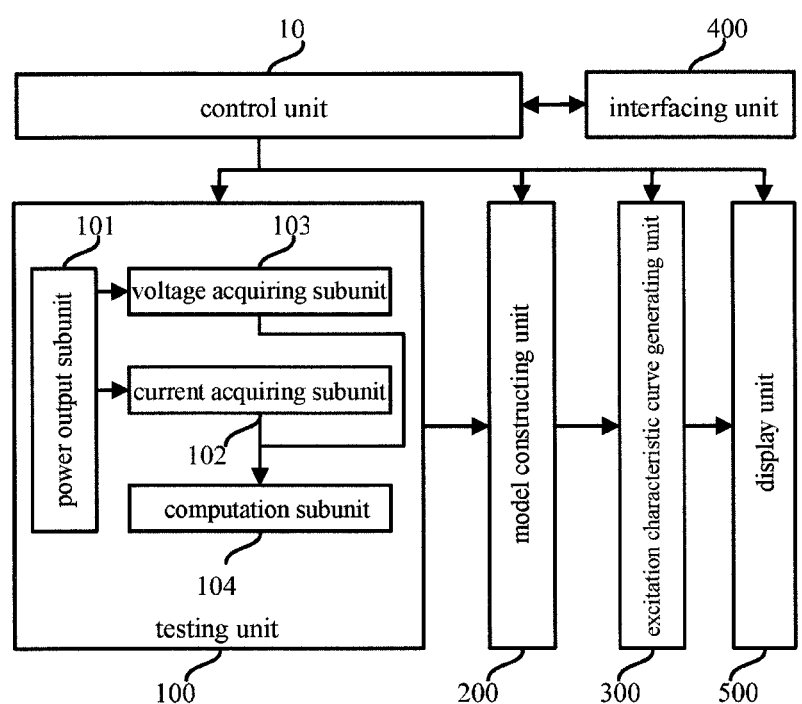
FIG. 3 is a block diagram of an apparatus for testing the excitation characteristic of the CTs in accordance with an embodiment.

As shown in FIG. 3, an apparatus for testing the excitation characteristic of the CT is provide according to an embodiment. The apparatus comprises a testing unit 100, a model constructing unit 200 and an excitation characteristic curve generating unit 300.

The testing unit 100 is operable to alternately apply positive and negative DC voltages to the terminals of the secondary winding of the CT to be tested and to acquire the current in the secondary loop.

The model constructing unit 200 is operable to construct, according to the relationship between the magnetic flux of the secondary winding iron-core and the rms equivalent voltage at rated frequency of the CT, the mathematical model representing the relationship between the current in the secondary loop and the rms equivalent voltage. The excitation characteristic curve generating unit 300 is operable to generate the excitation characteristic curve according to the mathematic model constructed by the model constructing unit 200.

In the apparatus of the present embodiment, the testing unit 100 may further comprise a power output subunit 101 and a current acquiring subunit 102. The power output subunit 101 is for alternately applying across the terminals of the secondary windings of the CT positive DC voltage and negative DC voltage for at least one time. The current acquiring subunit 102 is for acquiring the current in the secondary loop of the secondary windings of the CT.

Furthermore, the testing unit 100 may further comprise a voltage acquiring subunit 103 and a computation subunit 104. The power output subunit 101 is also configured for inputting a DC current of set value to the terminals of the secondary windings of the CT to be tested. The voltage acquiring subunit 103 is for acquiring the voltage across the terminals of the secondary windings when the DC current is input, and the current acquiring unit 102 acquires the current in the secondary loop of the secondary windings at this time point. The computation subunit 104 then computes the DC resistance of the secondary windings according to the voltage across the terminals of the secondary windings acquired by the voltage acquiring subunit 103 and the current in the secondary loop acquired by the current acquiring subunit 102.

Moreover, the apparatus of an embodiment may, among other things, further comprise a control unit 10, an interface unit 400 and a display unit 500.

The control unit 10 is connected with each constituent part of the apparatus to control the part for realizing its function.

The interface unit 400 can be connected with external devices such as mouse, keypad, PC and mobile terminal) for communicating with the external devices and receiving instructions input from the external devices, or outputting the excitation characteristic curve generated by the present apparatus.

The display unit 500 can be connected to the excitation characteristic curve generating unit 300 for displaying the generated excitation characteristic curve by the excitation characteristic curve generating unit 300.

The above embodiments are to be considered as illustrative and not restrictive. Certain changes and modifications can by made by those skilled in the art without departing from the scope of the appended claims. Thus, the scope of the claims is to be accorded with the broadest interpretation so as to encompass all such modifications and equivalent structures and functions.

The invention claimed is:

1. A method for testing excitation characteristic of a current transformer (CT), characterized in that the method comprises the steps of:

applying alternately positive and negative DC voltages across terminals of secondary winding of a CT to be tested, and acquiring a secondary current;

constructing a mathematical model of a relationship between the secondary current and a root mean square (rms) equivalent voltage at rated frequency of the CT from a relationship between a magnetic flux of a secondary winding iron-core of the CT and the rms equivalent voltage; and generating an excitation characteristic curve according to the mathematical model, wherein the mathematical model is:

$$Uc = \frac{2\pi f}{\sqrt{2}} * \left\{ \int_0^t [U(t) - Rct * Ict(t)]dt + \Phi(0) \right\}$$

where Uc is the rms equivalent voltage at the rated frequency of the CT, f is the rated frequency of the CT, U(t) is an amplitude of the DC voltage applied to the terminals of the secondary winding at time t, Rct is a DC resistance of the secondary winding, Ict(t) is the secondary current acquired at time t, and $\phi(0)$ is the magnetic flux of the secondary winding iron-core when time t=0, wherein the step of acquiring the secondary current each time the positive or negative DC voltage is applied across the terminals of the secondary winding of the CT to be tested comprises:

setting a target secondary current;

applying the positive or negative DC voltage across the terminals of the secondary winding of the CT to be tested; and acquiring the secondary current, and once the acquired secondary current reaches the target secondary current, the positive or negative DC voltage is stopped from being applied to the terminals of the secondary winding of the CT to be tested.

2. The method of claim 1, wherein in the step of applying alternately the positive and negative DC voltages across the terminals of the secondary winding of the CT to be tested and acquiring the secondary current, the positive and the negative DC voltage are applied for at least one time.

3. The method of claim 2, wherein the target secondary current set each time is the same or not all the same; the amplitude of the positive and negative DC voltage applied each time is the same or not all the same.

4. The method of claim 3, wherein the method further comprises:

supplying a DC current to the terminals of the secondary winding of the CT to be tested, and measuring the voltage across the terminals of the secondary winding as well as the secondary current; and obtaining the DC resistance (Rct) of the secondary winding from the measured voltage across the terminals of the secondary winding and the measured secondary current.

5. The method of claim 4, wherein the amplitude of the positive and negative DC voltage applied each time is larger than Rct*Ict$_{target}$, where Ict$_{target}$ is the set target secondary current.

6. The method of claim 2, wherein the method further comprises:

supplying a DC current to the terminals of the secondary winding of the CT to be tested, and measuring the voltage across the terminals of the secondary winding as well as the secondary current; and obtaining the DC resistance (Rct) of the secondary winding from the measured voltage across the terminals of the secondary winding and the measured secondary current.

7. The method of claim 6, wherein the amplitude of the positive and negative DC voltage applied each time is larger than Rct*Ict$_{target}$, where Ict$_{target}$ is the set target secondary current.

8. The method of claim 1, wherein the target secondary current set each time is the same or not all the same; the amplitude of the positive and negative DC voltage applied each time is the same or not all the same.

9. The method of claim 8, wherein the method further comprises:

supplying a DC current to the terminals of the secondary winding of the CT to be tested, and measuring the voltage across the terminals of the secondary winding as well as the secondary current; and obtaining the DC resistance (Rct) of the secondary winding from the measured voltage across the terminals of the secondary winding and the measured secondary current.

10. The method of claim 9, wherein the amplitude of the positive and negative DC voltage applied each time is larger than Rct*Ict$_{target}$, where Ict$_{target}$ is the set target secondary current.

11. The method of claim 1, wherein the method further comprises:

supplying a DC current to the terminals of the secondary winding of the CT to be tested, and measuring the voltage across the terminals of the secondary winding as well as the secondary current; and obtaining the DC resistance (Rct) of the secondary winding from the measured voltage across the terminals of the secondary winding and the measured secondary current.

12. The method of claim 11, wherein the amplitude of the positive and negative DC voltage applied each time is larger than Rct*Ict$_{target}$, where Ict$_{target}$ is the set target secondary current.

13. An apparatus for testing excitation characteristic of a current transformer comprising:

a testing unit configured to apply alternately positive and negative DC voltages across terminals of secondary winding of a CT to be tested, and acquire a secondary current;

a model constructing unit configured to construct a mathematical model of a relationship between the secondary current and a rms equivalent voltage at rated frequency of the CT from a relationship between a magnetic flux of a secondary winding iron-core of the CT and the rms equivalent voltage; and an excitation characteristic curve generating unit configured to generate the excitation characteristic curve according to the model constructed by the model constructing unit, wherein the mathematical model is:

$$Uc = \frac{2\pi f}{\sqrt{2}} * \left\{ \int_0^t [U(t) - Rct * Ict(t)]dt + \Phi(0) \right\}$$

where Uc is the rms equivalent voltage at the rated frequency of the CT, f is the rated frequency of the CT, U(t) is an amplitude of the DC voltage applied to the terminals of the secondary winding at time t, Rct is a DC resistance of the secondary winding, Ict(t) is the secondary current acquired at time t, and $\phi(0)$ is the magnetic flux of the secondary winding iron-core when time t=0, wherein to acquire the secondary current each time the positive or negative DC voltage is applied across the terminals of the secondary winding of the CT to be tested, the testing unit sets a target secondary current, applies the positive or negative DC voltage across the terminals of the secondary winding of the CT to be tested, and acquires the secondary current, and once the acquired secondary current reaches the target secondary current, the positive or negative DC voltage is stopped from being applied to the terminals of the secondary winding of the CT to be tested.

14. The apparatus of claim 13, wherein the testing unit comprises:

a power output subunit configured to apply alternately the positive and negative DC voltage across the terminals of the secondary winding of the CT to be tested; and a current acquiring subunit configured to acquire the secondary current of the secondary winding of the CT to be tested after applying the DC voltage across the terminals of the secondary winding of the CT to be tested by the power output subunit.

15. The apparatus of claim 14, wherein the power output subunit is further configured to supply a DC current to the terminals of the secondary winding of the CT to be tested;

the testing unit further comprises:

a voltage acquiring subunit configured to acquire the voltage across the terminals of the secondary winding of the CT to be tested after the DC current is supplied;

wherein the current acquiring subunit is further configured to acquire the secondary current of the CT to be tested after the DC current is supplied; and a computation subunit configured to compute the DC resistance of the secondary winding, according to the voltage across the terminals of the secondary winding acquired by the voltage acquiring subunit and the secondary current acquired by the current acquiring subunit.

* * * * *